United States Patent [19]

Sugiyama

[11] Patent Number: 5,331,477
[45] Date of Patent: Jul. 19, 1994

[54] LOW VOLTAGE, CONSTANT CURRENT MAGNETIC TRANSDUCER DRIVE SYSTEM FOR DIGITAL RECORDING

[75] Inventor: Sho Sugiyama, Iruma, Japan

[73] Assignee: TEAC Corporation, Tokyo, Japan

[21] Appl. No.: 992,451

[22] Filed: Dec. 17, 1992

[30] Foreign Application Priority Data

Dec. 24, 1991 [JP] Japan ............... 3-112007[U]

[51] Int. Cl.⁵ .................. G11B 5/00; G11B 5/09; G11B 5/03
[52] U.S. Cl. ........................ 360/59; 360/46; 360/66
[58] Field of Search ............ 360/46, 59, 61, 67, 360/68; 307/490, 491, 571, 570

[56] References Cited

U.S. PATENT DOCUMENTS

| | | | |
|---|---|---|---|
| 3,618,119 | 11/1971 | Rodriquez | 360/46 |
| 3,763,383 | 10/1973 | Johnson | 360/46 X |
| 4,466,027 | 8/1984 | Howell et al. | 360/67 X |
| 5,216,553 | 6/1993 | Nakamura | 360/46 |

FOREIGN PATENT DOCUMENTS 3-276404 3/1991 Japan.

*Primary Examiner*—Donald Hajec
*Assistant Examiner*—Le Thien Minh
*Attorney, Agent, or Firm*—Woodcock Washburn Kurtz Mackiewicz & Norris

[57] ABSTRACT

A magnetic transducer has its opposite coil extremities connected to a direct current power supply via a pair of inductance elements, respectively. The transducer coil is excited not only from the power supply but from the inductance elements as a write control circuit applies a binary write control signal, representative of digital information to be recorded, to a pair of semiconductor switches thereby causing the same to be alternately turned on and off. Being typically in the form of metal oxide semiconductor field effect transistors, the semiconductor switches permit the flow therethrough of a current of varying magnitudes when open. A pair of reverse blocking diodes are therefore connected in series with the respective semiconductor switches in order to make constant the current flowing through the transducer.

3 Claims, 4 Drawing Sheets

$I_h$

LOW VOLTAGE, CONSTANT CURRENT MAGNETIC TRANSDUCER DRIVE SYSTEM FOR DIGITAL RECORDING

BACKGROUND OF THE INVENTION

This invention relates generally to magnetic or magneto-optical recording systems for digital information, and more specifically to such a system capable of driving a magnetic transducer with a current higher than that due only to a power supply of a given voltage, in order to make possible the recording of high frequency digital signals.

Magnetic transducers are inductive, so that they offer high impedances when recording high frequency digital information. Correspondingly high drive voltages are therefore required. It might be contemplated to provide inductance capacitance resonance networks in order to obtain sufficiently high voltages. This solution is unsatisfactory because it would be difficult to maintain LC resonance in cases where the information being recorded varies in a wide range of frequencies.

Another solution is found in Japanese Unexamined Patent Publication No. 3-276404. This prior art system (shown in FIG. 1 of the drawings attached hereto) teaches the connection of a pair of inductance elements between a direct current power supply and the respective extremities of a transducer coil. Two switches are alternately turned on and off to cause the transducer to be excited from the power supply via one of the inductance elements and then the other. Energy is stored on one of the inductance elements when the transducer is being excited via the other. Accordingly, when the transducer is subsequently excited via said one inductance element, the energy that has been stored thereon is also utilized to energize the transducer. A net current flowing through the transducer is therefore of greater magnitude than the current offered solely by the power supply.

This prior art transducer drive system is objectionable as the semiconductor switches usually take the form of metal oxide semiconductor field effect transistors. Such switches permit the flow therethrough of a current of varying magnitudes when off. Consequently, the current flowing through the transducer has so far been not constant. The prior art system has thus necessitated a waste of power, as will be later discussed in more detail.

SUMMARY OF THE INVENTION

The present invention seeks to drive a magnetic transducer with a more constant current, and with a lower voltage, than heretofore.

Briefly, the invention may be summarized as a low voltage, constant current digital recording system comprising a magnetic transducer having a coil, a direct current power supply, and a pair of inductance elements connected respectively between the opposite extremities of the transducer coil and a first terminal of the power supply. Also included are a pair of semiconductor switches connected respectively between the opposite extremities of the transducer coil and a second terminal of the power supply. A write control circuit is connected to the switches for applying thereto a binary write control signal representative of digital information to be recorded, in order to cause the switches to be alternately turned on and off, with the consequent excitation of the transducer coil from both the power supply and the inductance elements. The invention particularly features a pair of reverse blocking diodes connected in series with the pair of semiconductor switches, respectively.

The reverse blocking diodes function to prevent current flow, during the excitation of the transducer coil with the closure of either of the semiconductor switches, through the other of the semiconductor switches. The transducer coil can therefore be excited with a more constant current, and with a lower supply voltage, than heretofore.

The provision of the reverse blocking diodes according to the invention might give rise to ringing. This danger can be precluded by providing a pair of additional inductance elements and/or a resistor or resistors.

The above and other features and advantages of this invention and the manner of realizing them will become more apparent, and the invention itself will best be understood, from a study of the following description and appended claims, with reference had to the attached drawings showing the closest prior art and the preferred embodiments of the invention.

DETAILED DESCRIPTION

Figure 1:
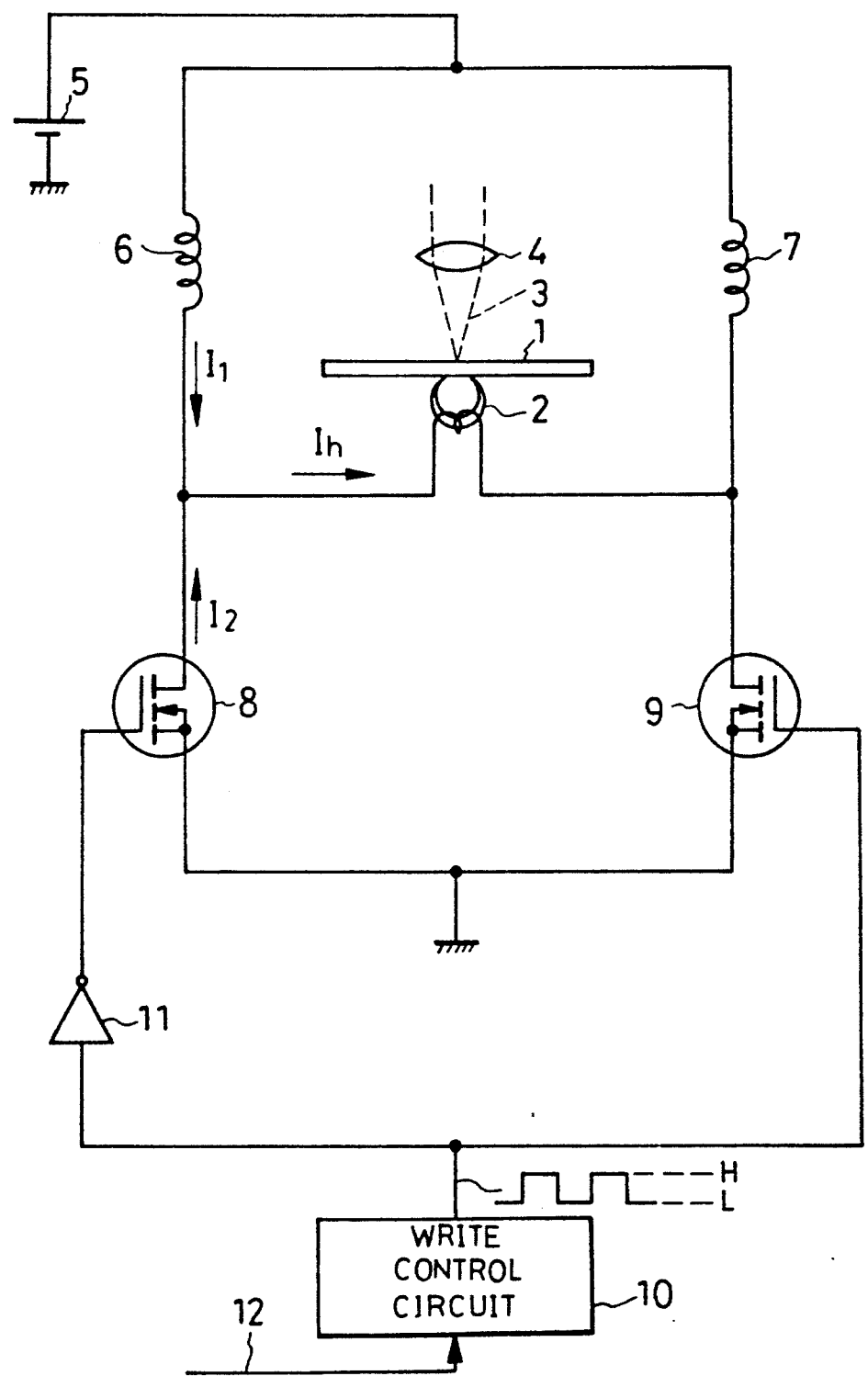
FIG. 1 is a schematic electrical diagram of the prior art digital recording system.

It is considered essential that the noted prior art closest to the present invention be shown and described in more detail, the better to make clear the features and advantages of the invention. With reference therefore to FIG. 1, which shows the prior art transducer drive circuit as employed in a magneto-optic disk drive, there is provided at 1 a rotating data storage disk 1. A data transducer 2 magneto-optically writes digital information on the disk 1 as a small spot on the disk surface is heated above a critical temperature by a laser beam 3 focused thereon by a lens 4. The direction of a current flowing through the transducer 2 determines the direction in which the spot is magnetized when it cools.

A first inductance element 6 is connected between a first terminal of a d.c. power supply 5 and a first coil extremity of the transducer 2, as and a second inductance element 7 between the first terminal of the power supply 5 and a second coil extremity of the transducer. Both inductance elements 6 and 7 are shown as chokes. A first semiconductor switch 8 is connected between the first coil extremity of the transducer 2 and a second terminal, that is, ground, of the power supply 5, and a second semiconductor switch 9 between the second coil extremity of the transducer and the second terminal of the power supply. Both semiconductor switches 8 and 9 are shown as insulating gate, metal oxide semiconductor field effect transistors, each with a substrate connected to a source.

For controlling the direction of a current flowing through the transducer 2 there is provided a write control circuit 10 which is connected to the first semiconductor switch 8 via an inverter 11 and directly to the second semiconductor switch 9. The write control circuit 10 puts out a binary write control signal in response to digital information supplied over a line 12.

The first switch 8 is on, and the second switch 9 off, when the output from the write control circuit 10 is low. A direct current from the power supply 5 will flow through a circuit comprising the first inductance element 6 and first switch 8, with the consequent storage of energy in the first inductance element. At the same time, the current will flow through another circuit comprising the second inductance element 7, transducer 2 and first switch 8. The transducer 2 will therefore be driven from both power supply 5 and second inductance element 7 because the second inductance element will have had energy stored thereon during the previous closure of the second switch 9. The transducer 2 can thus be energized with a current of greater magnitude than if it were excited only from the power supply 5.

When the output from the write control circuit 10 is high, on the other hand, the second switch 9 is on, and the first switch 8 off. The current will then flow from the power supply 5 through the circuit comprising the first inductance element 6, transducer 2 and second switch 9. The transducer 2 will then be driven not only from the power supply but also from the first inductance element 6, the latter having had the energy stored previously thereon. Energy will be stored at the same time on the second inductance element 7 as the current will also flow therethrough upon closure of the second switch 9.

Thus the transducer 2 is driven in either of two opposite directions depending upon the state of the output from the write control circuit 10. The heated spot on the surface of the disk 1 will be magnetized in a direction determined by the direction of current flow through the transducer 2.

Typically, the inductance elements 6 and 7 of this prior art transducer drive system have each an inductance of 680 microhenries, compared with an inductance of 10 microhenries possessed by the transducer 2. Such high inductances enable the elements 6 and 7 to perform the desired voltage boosting and current regulating functions, making it possible to drive the transducer with a current of much greater magnitude than that due only to the power supply 5.

Figure 2:
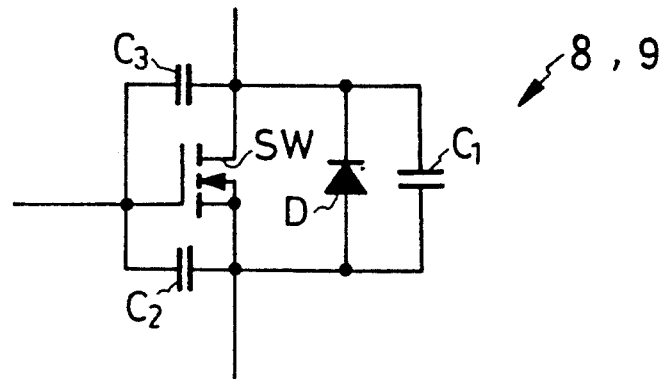
FIG. 2 is an equivalent circuit diagram of each metal oxide semiconductor field effect transistor switch used in the prior art system of FIG. 1.

The metal oxide semiconductor field effect transistors used as the semiconductor switches 8 and 9 can each be equivalently diagramed as in FIG. 2. Each switching transistor is herein shown to comprise a switch SW, diode D, drain-source capacitance $C_1$, source-gate capacitance $C_2$ and drain-source capacitance $C_3$. A current flows through the diode D or capacitors $C_1$-$C_3$ even when the switch SW is off.

Figure 3:
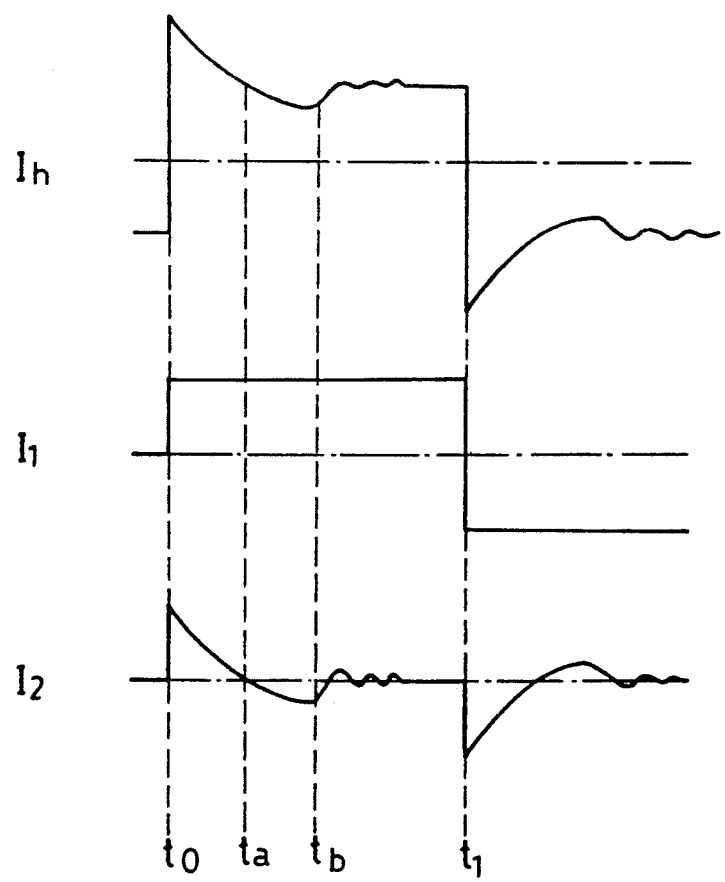
FIG. 3 is a diagram of waveforms useful in explaining the problem with the prior art system of FIG. 1.

Consequently, as diagramed in FIG. 3, the current Ih flowing through the transducer 2 during the conductive period $t_0$-$t_1$ of, say, the second switch 9 is not constant but varies in magnitude with time. The current Ih is the resultant of currents $I_1$ and $I_2$ shown also in FIG. 3. The current $I_1$, flowing from power supply 5 to transducer 2 via the first inductance element 6, can be shown as practically constant. The current $I_2$, however, which flows through the closed circuit comprising the transducer 2 and switches 8 and 9 because of the energy stored on the inductive transducer, unavoidably varies in magnitude as shown. The noted variations in the magnitude of the transducer current Ih are due to the current $I_2$.

It must also be taken into account that the variations in the transducer current Ih take place regardless of variations in the durations of the write control pulses applied to the switches 8 and 9. Refer to FIG. 3 again. The minimum value of the transducer current Ih changes depending upon whether the pulse duration is from $t_0$ to ta or from $t_0$ to tb. Let us assume that the transducer current value at tb is the minimum required to assure a magnetic field strength of the required minimum. Then a current of more than the required minimum magnitude is applied to the transducer in cases where the pulse duration is from $t_0$ to ta, resulting in the waste of energy.

Figure 4:
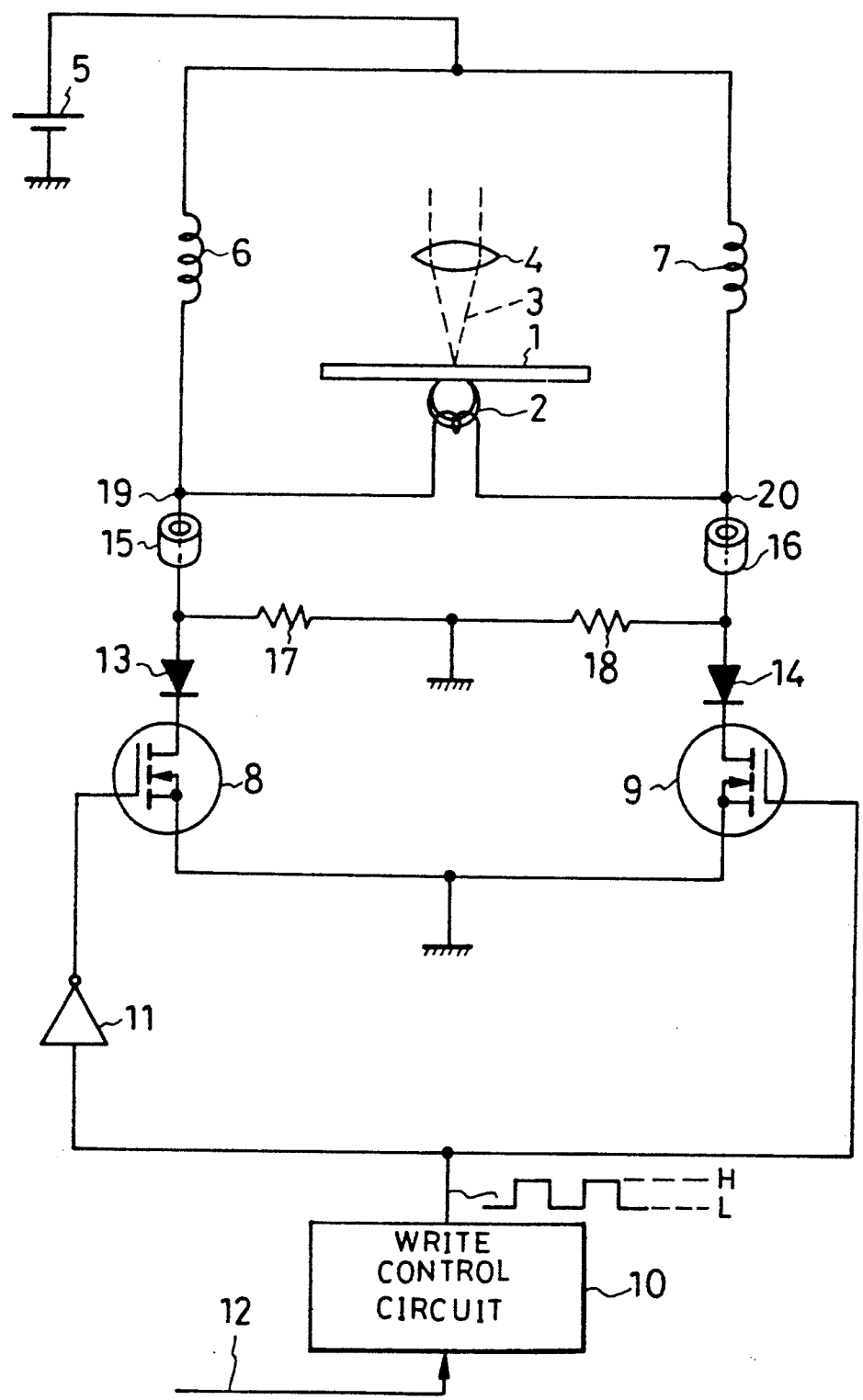
FIG. 4 is a schematic electrical diagram of the improved digital recording system in accordance with the invention.

In order to overcome this weakness of the prior art, the present invention provides the improved digital recording system shown in FIG. 4. A comparison of this figure with FIG. 1 will reveal that the recording system according to the invention differs from the prior art in additionally comprising a pair of reverse blocking diodes 13 and 14, a pair of antiringing inductance elements 15 and 16, and a pair of antiringing resistors 17 and 18. All the other parts of the recording system according to the invention have their corresponding parts in the FIG. 1 prior art system. Like reference numerals are therefore used to denote such like parts, and their description will be omitted.

The pair of reverse blocking diodes 13 and 14 are connected respectively between the pair of semiconductor switches 8 and 9 and circuit points 19 and 20 through which the pair of inductance elements 6 and 7 are connected directly to the transducer 2. Preferably, these diodes 13 and 14 are of the known fast recovery construction.

Figure 5:
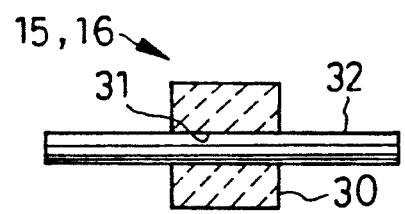
FIG. 5 is a sectional illustration of each antiringing inductance element used in the improved system of FIG. 4.

The pair of antiringing inductance elements 15 and 16 are connected respectively between the pair of circuit points 19 and 20 and the pair of reverse blocking diodes 13 and 14. As shown in FIG. 5, the antiringing inductance elements 15 and 16 can each be of the familiar one turn construction, comprising a ferrite bead 30 with a wire 32 extending through its hole 31.

The pair of antiringing resistors 17 and 18 are connected in parallel with the transducer 2 via the pair of antiringing inductance elements 15 and 16, respectively. Further the interconnection between these resistors 17 and 18 is grounded.

Typically, the inductance elements 6 and 7 have each an inductance of 680 microhenries. The transducer 2 has an inductance of 10 microhenries. The ferrite beads 30 of the antiringing inductance elements 15 and 16 are BL01RN1-62A manufactured by Murata Seisakusho K.K., of Japan. The antiringing resistors 17 and 18 have each a resistance of 500 ohms. The semiconductor switches 8 and 9 are field effect transistors 2SK762. The power supply 5 has a 1000 picofarads capacitor between a pair of supply lines.

Figure 6:
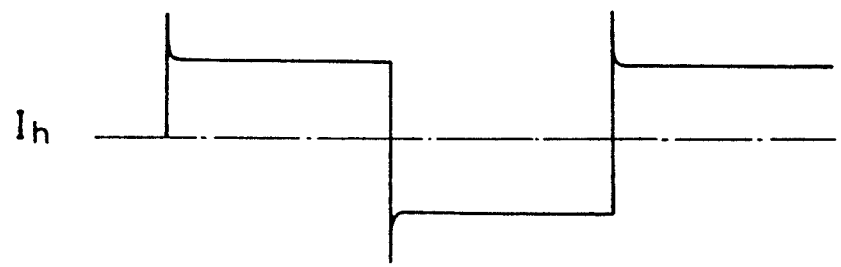
FIG. 6 is a diagram of the waveform of a transducer current in the improved system of FIG. 4.

The pair of reverse blocking diodes 13 and 14 function to prevent the flow of the currents $I_2$ from the semiconductor switches 8 and 9 toward the transducer 2. The transducer current Ih can thus be made constant as shown in FIG. 6; in other words, the transducer can be driven with a current of constant, minimum required magnitude regardless of the durations of the write control pulses.

The addition of only the reverse blocking diodes 13 and 14 to the prior art recording system of FIG. 1 might result in high frequency ringing. This danger is effectively precluded by providing the inductance elements 15 and 16 and the resistors 17 and 18.

Possible Modifications

Figure 7:
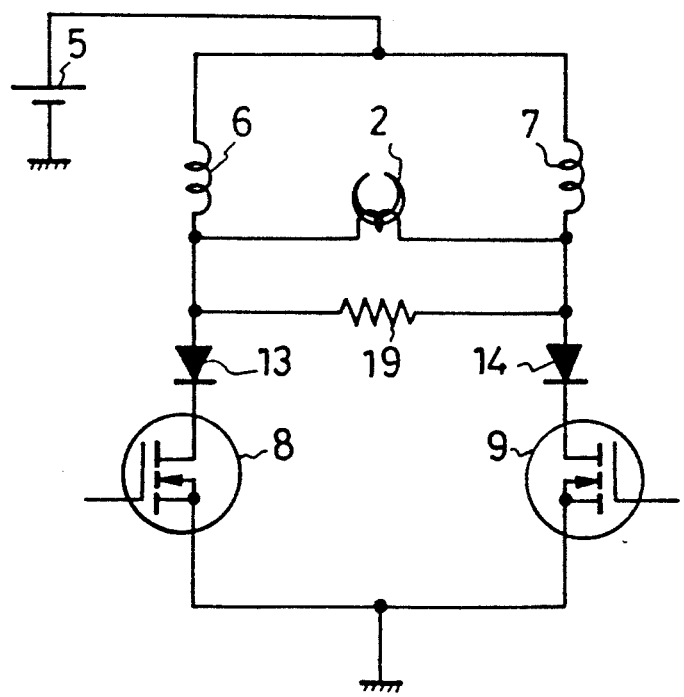
FIG. 7 is a schematic electrical diagram of another preferred form of digital recording system in accordance with the invention.

Although the present invention has been shown and described in the foregoing in very specific aspects thereof, it is not desired that the invention be limited by the exact details of such disclosure. The following, then, is a brief list of possible modifications, alterations and adaptations of the illustrated embodiment which are all believed to fall within the scope of this invention:

1. The pair of grounded resistors 17 and 18, FIG. 4, could be omitted, or replaced by a single resistor 19 connected in parallel with the transducer 2 as shown in FIG. 7.

2. The pair of antiringing inductance elements 15 and 16 could also be omitted as in FIG. 7.

3. The pair of reverse blocking diodes 13 and 14 could be connected to the sources of the semiconductor switches 8 and 9.

4. Schottky barrier diodes could be employed as the reverse blocking diodes 13 and 14.

5. The invention could be applied to magnetic storages rather than to magneto-optical storages.

What is claimed is:

1. A low voltage, constant current digital recording system comprising:
   (a) a magnetic transducer having a coil;
   (b) a direct current power supply;
   (c) a pair of inductance elements connected respectively between a pair of opposite extremities of the transducer coil and a first terminal of the power supply;
   (d) a pair of semiconductor switches connected respectively between the pair of opposite extremities of the transducer coil and a second terminal of the power supply;
   (e) a write control circuit connected to the pair of semiconductor switches for applying thereto a binary write control signal representative of digital information to be recorded, in order to cause the semiconductor switches to be alternately turned on and off, with the consequent excitation of the transducer coil not only from the power supply but also from the inductance elements;
   (f) a pair of reverse blocking diodes connected in series with the pair of semiconductor switches, respectively, in order to prevent current flow, during the excitation of the transducer coil with the closure of either of the semiconductor switches, through the other of the semiconductor switches; and
   (g) a pair of antiringing inductance elements connected in series with the pair of semiconductor switches, respectively;
   (h) whereby the transducer coil can be excited with a more constant current, and with a lower supply voltage, than heretofore.

2. The low voltage, constant current digital recording system of claim 1 wherein each antiringing inductant element comprises:
   (a) A bead of magnetic material having a hole; and
   (b) a conductor extending through the hole in the bead.

3. A low voltage, constant current digital recording system comprising:
   (a) a magnetic transducer having a coil;
   (b) a direct current power supply;
   (c) a pair of inductance elements connected respectively between a pair of opposite extremities of the transducer coil and a first terminal of the power supply;
   (d) a pair of semiconductor switches connected respectively between the pair of opposite extremities of the transducer coil and a second terminal of the power supply;
   (e) a write control circuit connected to the pair of semiconductor switches for applying thereto a binary write control signal representative of digital information to be recorded, in order to cause the semiconductor switches to be alternately turned on and off, with the consequent excitation of the transducer coil not only from the power supply but also from the inductance elements;
   (f) a pair of reverse blocking diodes connected in series with the pair of semiconductor switches, respectively, in order to prevent current flow, during the excitation of the transducer coil with the closure of either of the semiconductor switches, through the other of the semiconductor switches;
   (g) a first antiringing resistor connected between the first extremity of the transducer coil and ground; and
   (h) a second antiringing resistor connected between the second extremity of the transducer coil and the ground;
   (i) whereby the transducer coil can be excited with a more constant current, and with a lower supply voltage, than heretofore.

* * * * *